United States Patent
Ebersman

(10) Patent No.: US 6,728,920 B1
(45) Date of Patent: Apr. 27, 2004

(54) METHOD FOR CORRECTING ERRORS IN TRANSFER OF INFORMATION

(75) Inventor: Howard Glen Ebersman, Rochester, NY (US)

(73) Assignee: Adaptive Broadband Corporation, Sunnyvale, CA (US)

( * ) Notice: Subject to any disclaimer, the term of this patent is extended or adjusted under 35 U.S.C. 154(b) by 0 days.

(21) Appl. No.: 09/317,549

(22) Filed: May 24, 1999

(51) Int. Cl.[7] .............................................. H03M 13/00
(52) U.S. Cl. ........................ 714/752; 714/751; 714/701
(58) Field of Search ................................ 714/752, 701, 714/751, 749, 755, 758, 776, 746

(56) References Cited

U.S. PATENT DOCUMENTS

| | | | |
|---|---|---|---|
| 3,685,016 A | * | 8/1972 | Eachus |
| 4,644,543 A | | 2/1987 | Davis, Jr. |
| 4,769,818 A | | 9/1988 | Mortimer |
| 4,956,709 A | | 9/1990 | Richer et al. |
| 5,010,553 A | | 4/1991 | Scheller et al. |
| 5,010,554 A | | 4/1991 | Bechtel et al. |
| 5,220,568 A | | 6/1993 | Howe et al. |
| 5,247,523 A | | 9/1993 | Arai et al. |
| 5,260,840 A | * | 11/1993 | Hatanaka et al. |
| 5,282,211 A | | 1/1994 | Manlick et al. |
| 5,285,497 A | | 2/1994 | Thatcher, Jr. |
| 5,313,475 A | | 5/1994 | Cromer et al. |
| 5,321,703 A | | 6/1994 | Weng |
| 5,432,787 A | | 7/1995 | Chethik |
| 5,528,607 A | | 6/1996 | Weng et al. |
| 5,548,598 A | | 8/1996 | Dupont |
| 5,596,589 A | * | 1/1997 | Thomsen et al. |
| 5,600,663 A | | 2/1997 | Ayanoglu et al. |
| 5,631,907 A | | 5/1997 | Guarneri et al. |
| 5,699,365 A | | 12/1997 | Klayman et al. |
| 5,699,369 A | | 12/1997 | Guha |
| 5,844,918 A | * | 12/1998 | Kato |
| 6,079,043 A | * | 6/2000 | Yoshiura et al. |

OTHER PUBLICATIONS

M. Aghadavoodi Jolfaei, U. Querheim, Multicopy ARQ Strategies for Heterogeneous Networks, Protocols for High Speed Networks IV, 1994, pp. 155–168, Chapman & Hall.
David Chase, Code Combining–A Maximum–Llkelihood Decoding Approach for Combining an Arbitrary Number of Noisy Packets, IEEE Transactions on Communications, May 1985, pp. 385–393, vol. COM–33, No. 5.
Thierry Turletti, From Speech to Radio Waves, Jun. 1996.
Hans Werner Arweiler, Siemens Dynamic Duo, telcom report International, at least as early as May.
Farhood Moslehi, Wireless Connectivity, 1996.
Cyclic Redundancy Check (CRC), at least as early as May 1999.

(List continued on next page.)

Primary Examiner—Phung M. Chung
(74) Attorney, Agent, or Firm—Stephen B. Salai, Esq.; Brian B. Shaw, Esq.; Harter, Secrest & Emery LLP

(57) ABSTRACT

Family of methods for correcting errors in transfer of information over a lossy medium. The message to be sent is first broken into Data Blocks, which are further divided into N data segments. These data segments are sent verbatim and followed by XOR combinations of the data segments, called Error Correcting Segments. Incorrect Data or Error Correcting Segments are detected through the use of a CRC or any other error detection algorithm, and errored Data or Error Correcting Segments are discarded. Once all Data or Error Correcting Segments for a message segment are received, logic or a look up table is used to determine which of the Data Segments can be recovered. The lost Data Segment recovery is done using a binary XOR of multiple good Data or Error Correcting Segments. For additional error correction, Data and Error Correcting Segments can also be repeatedly transmitted multiple times to further improve the performance of this algorithm.

21 Claims, 5 Drawing Sheets

OTHER PUBLICATIONS

Thierry Turletti, Convolutional Coding / Decoding, Jun. 1996.
Thierry Turletti, Error Detecting Codes, Jun. 1996.
Direct Sequence, Sep. 1997.
The Principles of Spread Spectrum Communication, at least as early as May 1999.
Hannu Kauppinen, Machine Vision and Media Processing Group, Applied research: Video coding for wireless channels, Jan. 1998.

Block Coding, Jun. 1998.

* cited by examiner

| Block Number | Segment Number | User Data | CRC |

FIG.7

| Block 0 | Segment 0 | Segment "A" of user data block 0 | CRC |
| Block 0 | Segment 1 | Segment "B" of user data block 0 | CRC |
| Block 0 | Segment 2 | Segment "C" of user data block 0 | CRC |

| Block 0 | Segment 6 | Segment "A+B+C" of user data block 0 | CRC |
| Block 1 | Segment 0 | Segment "A" of user data block 1 | CRC |

FIG.8

METHOD FOR CORRECTING ERRORS IN TRANSFER OF INFORMATION

FIELD OF THE INVENTION

The present invention relates to an error correction method for a lossy communications environment. It may readily be applied to a high traffic or high loss multipoint system. The present invention may be used in any digital communications system, including such applications as satellite communications systems, terrestrial radio systems, and cellular phone systems. The present invention is useable for Internet and Intranet broadcasting.

BACKGROUND OF THE INVENTION

Communications systems need to reliably transmit information to all users within that system. To accomplish this, data is often broken into smaller pieces called packets which can be easily managed by the communications system. Communications systems invariably suffer from corrupted bits and lost packets, resulting from a multitude of causes, including, but not limited to interference, noise, and buffer overflows.

To recover corrupted bits and lost packets, many error correcting techniques may be applied. The most common is called a Forward Error Correcting Code (FEC) which may correct single or multiple errors in a packet. An FEC works by adding error correcting bits to the transmitted packet. Unfortunately, if too many errors occur in a packet, the corrupted packet will remain corrupted or be lost, even with the use of an FEC code. Because of this, errors resulting from interference and buffer overflows are generally not correctable with an FEC code. Another disadvantage is that there is a necessary bandwidth overhead in sending the parity bits required by an FEC code.

To detect the occurrence of corrupted packets, existing systems can use an error detection algorithm. Commonly used error detection algorithms include the Cyclic Redundancy Checking (CRC) algorithm and checksum algorithm, which can detect the occurrence of multiple errors. A technique of adding parity bits can be used to detect single and odd numbers of errors.

The absence of a packet that is expected, usually resulting from strong interference or buffer overflows, can be detected by the addition of sequence information to the packet.

One method to greatly improve the probability of receiving an uncorrupted packet is to send the packet multiple times. In this case, any number of errors in a single packet, or even a lost packet, will not prohibit uncorrupted reception of the packet's information, as long as at least one packet is correctly received. Unfortunately, sending each packet R times requires R times as much bandwidth.

Another method to greatly reduce the probability of losing information is to request and retransmit a packet in the event that a packet is lost or corrupted. This method is often referred to as ARQ (automatic repeat request). To accomplish this, acknowledgments (ACKs), negative acknowledgments (NACKs), and timeout windows may be employed to identify which packets are incorrectly received or may need to be resent. These identified packets may be retransmitted as many times as necessary until the information is indicated to be successfully received. Two serious drawbacks of this method are that latency and bandwidth are increased with each retransmission. Also, the ACK and NACK messages themselves require additional bandwidth. The increased and non-deterministic latency of this protocol is not well suited to many types of traffic such as satellite communications systems. Also, the additional bandwidth required for the ACK and NACK messages make this method very poorly suited to communications systems that support broadcast of information to many or all users, as the bandwidth of the ACK and NACK messages increases with each user in the system. Broadcast of information is the transmission of identical information to multiple or all users in a communications system.

Each of these methods of packet recovery have some advantages over the others. However, the method of present invention has the advantage that information can be sent with a higher reliability, using the same amount of bandwidth, than the prior art method of repeating each packet multiple times.

The prior art methods have not been optimally effective in correcting errors in the transfer of information over some lossy mediums such as radio links, copper wires, or fiber optic cables, where the channel is randomly blocked due to interference or jamming.

SUMMARY OF THE INVENTION

The present invention relates to a method for correcting errors in the transfer of information over a lossy medium such as radio frequencies, copper wires, or fiber optic cables, where the channel is randomly blocked due to interference or jamming. However, it is not limited to lossy mediums, but may also be used in non-lossy mediums. The message is first divided into data blocks. The data blocks are then divided into data segments. The data segments of each data block are used to generate distinct combinations of data segments through a Boolean operation (such as XOR) or an arithmetic operation to form Error Correcting Segments. The Data Segments and Error Correcting Segments are transmitted. In the event that a Data Segment of the information is incorrectly received, the message can be entirely reconstructed as long as one valid subset of Data Segments is correctly received. In the case where a data block is divided into two Data Segments, three Data and Error Correcting Segments are transmitted. The retrieval of any two Data and Error Correcting Segments provides enough information to retrieve the full amount of information transmitted in the corresponding data block. In the case where a data block is divided into three data segments, seven Data and Error Correcting Segments are transmitted. The retrieval of any four good Data or Error Correcting Segments results in full retrieval of transmitted information. Furthermore, in the case where only three good Data Segment or Error Correcting Segments are received, there are only four out of the thirty five possible sets of three Data and Error Correcting Segments which will not lead to the retrieval of the complete message.

In the simplest case, after a message is divided into Data Blocks, each Data Block is further subdivided into two Data Segments A and B in which there is only one distinct combination of these Data Segments (for example, A⊕B, i.e., A XOR B). There is no acknowledge signal which is sent from the receiver to the transmitter. This reduces overhead and latency since no ACK or NACK messages need to be sent or awaited. The entire Data Block (i.e., both [A] and [B]) can be recovered if any of the following three Data or Error Correcting Segments are received: (1) [A],[B]; (2) [A],[A⊕B]; or (3) [B],[A⊕B].

The method provides significantly better performance for a fixed amount of overhead relative to simple repetition or repeat schemes. This method is particularly suitable for broadcast mediums and high latency applications such as satellite communications for which an ARQ scheme is not acceptable or practical. Lastly, this method will outperform a standard FEC code in a jamming type environment where errors are in the form of large bursts, such as frequency hopping radio that has strong interference on a percentage of frequencies. Further applications include Internet or Intranet broadcasting and may be used in any network architecture.

The present invention relates to an error correcting method for a multipoint communications system, comprising partitioning a message into Data Blocks in which each of the Data Blocks are further divided into N data segments, representing one or more bits. At least one distinct combination of N data segments is computed using a Boolean or arithmetic operator such as XOR to form Error Correcting Segments where N is equal to 2, 3, or a larger natural number. In the present invention, steps, in addition to receiving the Data or Error Correcting Segments, such as correcting bit errors and performing operations on the Data or Error Correcting Segments which have been received correctly are employed to recover as much of the data block information as possible.

In a variation of the error correcting method of the present invention, each of the Data or Error Correcting Segments is transmitted two or more times. This reduces the error rate at the expense of additional overhead.

The present invention is directed for use in any lossy environment, but is particularly useful in broadcast data systems such as communications systems exposed to intentional or unintentional jamming and satellite systems.

BRIEF DESCRIPTION OF THE DRAWINGS

FIG. 7 shows the logical structure of a Data or Error Correcting Segment which is transmitted.

FIG. 8 shows a sequence in which various Data or Error Correcting Segments are transmitted for N=3 case.

DETAILED DESCRIPTION OF THE PREFERRED EMBODIMENTS

The present invention relates to an error correcting method suitable for any multipoint communications system. In particular, it provides significantly improved bit error rate performance, for a given available bandwidth over existing methods for a broadcast multi-point system with large numbers of remote nodes. It also provides significant latency advantages over existing methods for satellite and other latency critical applications.

The present invention relies upon reversible operations.

Reversible Operations

A reversible operation is any operation that modifies information in such a way that it is recoverable through a reverse operation. Two examples of reverse operations are binary XOR and modulo addition. In the case of modulo addition, the reverse operation is modulo subtraction. Straight addition is also a reversible operation; however, it has the drawback that it is not easy to represent unbounded numbers in a communications system.

For binary XOR, $A = A \oplus B \oplus B$.

Example: $A = 011000101$ $B = 100101001$ $A \oplus B = 111101100$ $A \oplus B \oplus B = 011000101 = A$ For modulo addition, $$A = A + B - B.$$

Note that numbers always take a value between 0 and the base (A–F denote 10–15 in base 16). Numbers are represented by adding or subtracting the base value to fit it within the allowed values. Also, note that binary XOR is identical to modulo addition (or subtraction) using base 2.

Example, base 16:

$A = B149$ $B = 053C$ $$A + B = B675$$

$$A + B - B = B149 = A.$$

Example, base 10:

$A = 93542$ $B = 89625$ $$A + B = 72167$$

$$A + B - B = 93542 = A.$$

Preferred Embodiments

In the present method, a message is divided into Data Blocks consisting of one or more bits, each of the Data Blocks is further subdivided into N Data Segments. Then, the N Data Segments and each and every distinct combination of the N Data Segments (i.e., Error Correcting Segments) is transmitted at least once. Each of the distinct combinations are generated by performing a reversible Boolean or arithmetic operation on two or more Data Segments. A receiver processes the received Data Segments and Error Correcting Segments using the reverse operation to derive each of the N Data Segments which were not received or were discarded. One advantage in the present method is that there is no reliance on an acknowledge signal. By not incorporating any acknowledgment signals, such as ACK or NACK, the present method is very amenable to performing well in a large or highly lossy communications environment or high latency such as satellite systems.

Figure 1:
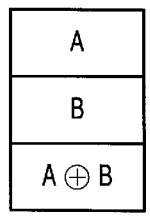
FIG. 1 shows a sequence of Data and Error Correcting Segments sent according to an embodiment of the present invention in which a Data Block of a message is divided into two Data Segments (N=2).

FIG. 1 shows an embodiment in which a data block is divided into two Data Segments A and B. In this embodiment, there is only one distinct combination of the Data Segments; i.e., A⊕B (A exclusive OR'ed with B). Unlike prior art methods, there is no acknowledge signal which is sent from the receiver to the transmitter. This permits faster communications and less overhead since no time need be spent waiting for a return message and the overhead of the ACK/NACK is not needed.

Figure 2:
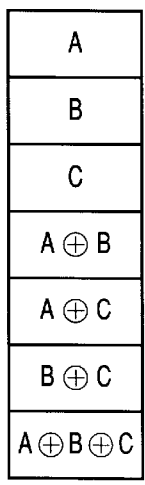
FIG. 2 shows a sequence of Data and Error Correcting Segments sent according to an embodiment of the present invention in which a Data Block of a message is divided into three Data Segments (N=3).

FIG. 2 shows a second embodiment in which a message Data Block is divided into three Data Segments: A, B, C. In this embodiment, there are four distinct Error Correcting Segments: A⊕B, A⊕C, B⊕C, and A⊕B⊕C.

Figure 3:
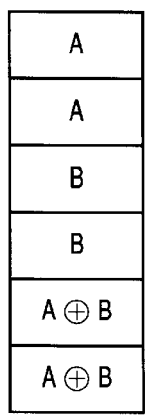
FIG. 3 shows a sequence of Data and Error Correcting Segments according to another embodiment of the present invention in which a Data Block of a message is divided into two Data Segments and each Data Segment and Error Correcting Segment is sent twice in succession (N=2, R=2).

FIG. 3 shows a third embodiment in which a message segment is divided into two Data Segments: A and B. In the third embodiment, the Data Segments and Error Correcting Segments are each transmitted twice: A, A, B, B, A⊕B, and A⊕B.

Figure 4:
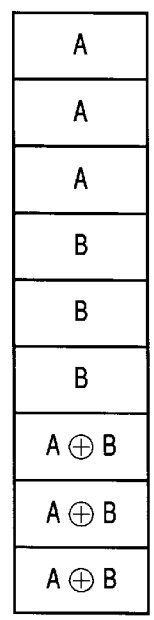
FIG. 4 shows a sequence of Data or Error Correcting Segments sent according to an embodiment of the present invention in which a Data Block of a message is divided into two Data Segments and each Data Segment and combination of Data Segments is sent three times (N=2, R=3).
Figure 5:
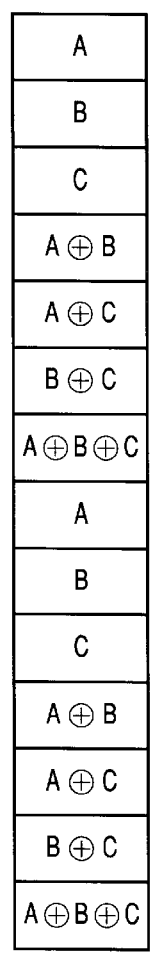
FIG. 5 shows a sequence of Data and Error Correcting Segments sent according to an embodiment of the present invention in which a Data Block of a message is divided into three Data Segments and each Data Segment and each Error Correcting Segment is sent a second time after all Data Segment and Error Correcting Segments are sent a first time (N=3, R=2).

FIGS. 4 and 5 show other more complex extensions of this method.

Figure 6:
FIG. 6 shows an embodiment in which a message is broken up into Y+1 Data Blocks and each Data Block is divided into N=3 Data Segments.

Patent Algorithm Description:

The message to be sent is broken into data blocks. Each data block, furthermore, is divided into N data segments labeled A, B, C, etc. as shown in FIG. 6. Error Correcting Segments are all unique combinations of the XOR (bitwise exclusive "or") of the N data segments. The size of each Data or Error Correcting Segment is preferably chosen such that each Data Segment or Error Correcting Segment has an independent probability of being blocked by interference or jamming. The Data and Error Correcting Segments need not be of the same size. Each Data Segment or Error Correcting Segment contains four fields: a block number, a sequence number, a data field, and a CRC or check field, as shown in FIG. 7.

As shown in FIG. 8, all Data Segment or Error Correcting Segments are transmitted. First, the Data segments of a data block representing actual data are transmitted. Second, the Error Correcting Segments formed by reversible operations from the Data Segments of a data block are then transmitted. Next, the Data Segments of the next Data Block are sent followed by transmission of the Error Correcting Segments. The process continues until all Data Block information has been transmitted.

The block number identifies the data block of the message being transmitted in a numerical sequence. This is a count value that increments after the completion of transmission of a data block and wraps to zero if it reaches the maximum block number value. This allows reliable detection of redundant information in the event that more packets may be lost. In an example of a Data Block consisting of three Data Segments A, B, and C, Data Segment or Error Correcting Segment #0 is [A], #1 is [B], #2 is [C], #3 is [A⊕B], #4 is [A⊕C], #5 is [B⊕C], and #6 is [A⊕B⊕C].

The check field determines the validity of the information, and protects the sequence and segment values, in addition to the user data.

When a Data Segment or Error Correcting Segment is received, its check field is processed to determine whether there has been any corruption of data. If the Data Segment or Error Correcting Segment is determined to be corrupted, it is discarded. Data and Error Correcting Segments may also not be received at all such as might occur in a burst error in a frequency hopping system. This can be detected by processing and interpreting the block and request number information. If the receiver completely misses a Data segment, the Data segment still may be reconstructed if a proper set of Data and Error Correcting Segments are received which are determined not to have errors.

The present method relies solely on the receiver's reception of Data Segments or Error Correcting Segments. If a Data segment is recovered, then the relevant section of the data block may be directly reconstructed with this part. If certain Data Segments are not directly recovered, they may still be derived through processing of other uncorrupted Data and Error Correcting Segments which have been received. In the event that certain Data Segments of a Data Block are not recoverable, then corrupted bits, zero fillers, or random bits may be inserted for those parts. For example, if a data block has three data segments, A, B, and C, and B is not recoverable, then the receiver sends out the data as A 0 C. In asynchronous systems, the unrecovered data can be deleted by sending just A C.

The cases of N=2 and N=3 are shown below, and the XOR is replaced by a "⊕" for ease of readability.

N=2:
  Transmitted Data Segment or Error Correcting Segment #1=[A]
  Transmitted Data Segment or Error Correcting Segment #2=[B]
  Transmitted Data Segment or Error Correcting Segment #3=[A⊕B]

N=3:
  Transmitted Data Segment or Error Correcting Segment #1=[A]
  Transmitted Data Segment or Error Correcting Segment #2=[B]
  Transmitted Data Segment or Error Correcting Segment #3=[C]
  Transmitted Data Segment or Error Correcting Segment #4=[A⊕B]
  Transmitted Data Segment or Error Correcting Segment #5=[B⊕C]
  Transmitted Data Segment or Error Correcting Segment #6=[A⊕C]
  Transmitted Data Segment or Error Correcting Segment #7=[A⊕B⊕C]

N=2, R=2:
  Transmitted Data Segment or Error Correcting Segment #1=[A]
  Transmitted Data Segment or Error Correcting Segment #2=[B]
  Transmitted Data Segment or Error Correcting Segment #3=[A⊕B]
  Transmitted Data Segment or Error Correcting Segment #4=[A]
  Transmitted Data Segment or Error Correcting Segment #5=[B]
  Transmitted Data Segment or Error Correcting Segment #6=[A⊕B]

Note that the order of transmitted segments is unimportant to the algorithm except for its effect on base case latency.

At the receiver, upon receipt of the transmitted Data or Error Correcting Segments, all erroneous Data and Error Correcting Segments are discarded. The remaining valid Data and Error Correcting Segments are used to regenerate all or some of the original N Data Segments of a Data Block.

In the case of N=2, the entire data block (i.e., [A] and [B]) can be recovered if any of the following sets of Data Segments and Error Correcting Segments are received:

[A],[B]

[A],[A⊕B]

[B],[A⊕B]

Partial information can be recovered if some single Data Segments are correctly received (i.e., [A] or [B]).

For the case of N=3, it turns out that any set of 4 or more of the 7 Data or Error Correcting Segments transmitted will result in the error free recovery of [A] [B] and [C]. Further, all but 4 sets out of the possible thirty five sets of 3 successfully received Data and Error correcting segments will result in successful recovery of all [A] [B] and [C].

These 4 sets are:

[A⊕B] [B⊕C] [A⊕C]—can not recover any information

[A⊕B⊕C] [A⊕B] [C]—can only recover [C]

[A⊕B⊕C] [A⊕C] [B]—can only recover [B]

[A⊕B⊕C] [B⊕C] [A]—can only recover [A]

For higher values of N, the number of valid combinations rapidly increases, rapidly increasing both the performance and complexity of the algorithm. However, if a simple look-up table is generated and used, the computation complexity of the algorithm stays small even for large N, but the memory requirements increase quickly.

The method for recovering information is to XOR the appropriate Data Segments or Error Correcting Segments to yield the desired Data Segments which need to be derived. For example, [A] XOR [A XOR B] will yield [B]. XOR is a associative operator, so switching the order of arguments being XOR'ed together will yield identical results.

For cases where N is very small, it is easy to implement each case directly into code. For larger N, a look up table is the easiest implementation. In any case, N should not be a large number as processing becomes overly complicated and correspondingly slow.

Algorithm Performance Comparisons:

The case where this algorithm is of most significance is in an environment where Data Segments or Error Correcting Segments are completely corrupted, often referred to as blocked, with a probability, $P_b$, and are received intact with no errors with a probability $(1-P_b)$. This environment occurs in the presence of intermittent interference.

In this scenario, a normal error correction code will only be throwing away bandwidth, since it is not capable of correcting the large numbers of errors that will occur if there is a large burst error, unless extremely large numbers of bits are interleaved, resulting in excessive latency. Even with this interleaving, it is believed that performance will generally not be as good as our proposed method.

In a scenario where some Data Segments or Error Correcting Segments are blocked, while others contain only a handful of errors, the combination of our patent method with a FEC code can be of benefit. In this case, the FEC corrects the Data Segment or Error Correcting Segments containing a small number of bit errors, and then the present method is applied to correct for the lost Data segments containing too many errors for an FEC to resolve.

Repetition Coding Performance:

A previously proposed algorithm for solving this problem is to use repetition coding. Using repetition coding, a data block is broken into Data Segments, and each Data Segment is transmitted R times. The probability of error (or missed message), denoted $P_e$, is found to be:

$$P_e = P_b^R$$

because each of R Data Segments in a row must be missed.

The channel efficiency of this scheme, which is equal to the ratio of new information to total information transmitted, is:

Channel Efficiency=(1 data segment of information in a Data Block/R Data Segments of that Data Block transmitted)=1/R Patent Algorithm Coding Performance:

By performing an exhaustive search on the possible combinations, we can find the probability of any particular data segment of a message being lost. In the case of N=2, we miss Data Segment [A] only if we receive Data segment [B] by itself, Error Correcting Segment [A⊕B] by itself, or no Data Segment or Error Correcting Segment.

$P(A$ missed$)=P([B]$ good$)\times P([A]$ bad$)\times P([A\oplus B]$ bad$)+P([A\oplus B]$ good$)\times P([A]$ bad$)\times P([B]$ bad$)+P([A]$ bad$)\times P([B]$ bad$)\times P([A\oplus B]$ bad$)$ $P(B$ missed$)=P([A]$ good$)\times P([B]$ bad$)\times P([A\oplus B]$ bad$)+P([A\oplus B]$ good$)\times P([A]$ bad$)\times P([B]$ bad$)+P([A]$ bad$)\times P([B]$ bad$)\times P([A\oplus B]$ bad$)$ Therefore, $$P_e = P(A \text{ missed}) = P(B \text{ missed}) = \Sigma^3_{k=2}\binom{3}{k}P_b^k q^{3-k} = \binom{3}{2}P_b^2(1-P_b) + P_b^3 = 3P_b^2(1-P_b)+P_b^3$$

For very small $P_b$, $P_e \cong 3P_b^2$.

Channel Efficiency=(2 data segments of information in a data block/3 Data Segment and Error Correcting Segments of that data block transmitted)=⅔≅67%.

In the case of N=3, the probability of a missed Data segment is found to be:

$$P_e=4P_b^4(1-P_b)^3+\Sigma^7_{k=5}\binom{7}{k}P_b^k q^{7-k}=4P_b^4(1-P_b)^3+21P_b^5(1-P_b)^2+7P_b^6(1-P_b)+P_b^7$$

For very small $P_b$, $P_e \cong 4P_b^4$.

Channel Efficiency=(3 data segments of information in a data block/7 Data Segment and Error Correcting Segments of that data block transmitted)=3/7=43%.

In the case of N=2, R=2, the probability of a missed message is found to be:

$$P_e=3P_b^4(1-P_b)^2+\Sigma^6_{k=5}\binom{6}{k}P_b^k q^{6-k}=3P_b^4(1-P_b)^2+6P_b^5(1-P_b)+P_b^6$$

For very small $P_b$, $P_e \cong 3P_b^4$.

Channel Efficiency=(2 data segments of information in a data block/6 Data Segment and Error Correcting Segments of that data block transmitted)=⅓≅33%.

FIG. 4 shows a fourth embodiment in which the data block is divided into two data segments and each Data Segment or Error Correcting Segment is transmitted three times (N=2, R=3).

In the case of N=2, R=3, the probability of a missed Data Segment is found to be:

$$P_e=3P_b^7(1-P_b)^2+9P_b^6(1-P_b)^3+\Sigma^9_{k=8}\binom{9}{k}P_b^k q^{9-k}=9P_b^6(1-P_b)^3+3P_b^7(1-P_b)^2+9P_b^8(1-P_b)+P_b^6$$

For very small $P_b$, $P_e \cong 9P_b^6$.

Channel Efficiency=(2 data segments of information in a data block/6 Data or Error Correcting Segments of that data block transmitted)=⅓≅33%.

FIG. 5 shows a fifth embodiment in which the message is divided into three Data segments and each Data Segment and Error Correcting Segment is transmitted once in succession and then a second time in the same order (N=3, R=2).

Graphically comparing the errored message probability when the blocking probability is varied, we can easily compare performance of schemes with similar channel efficiency.

Figure 9:
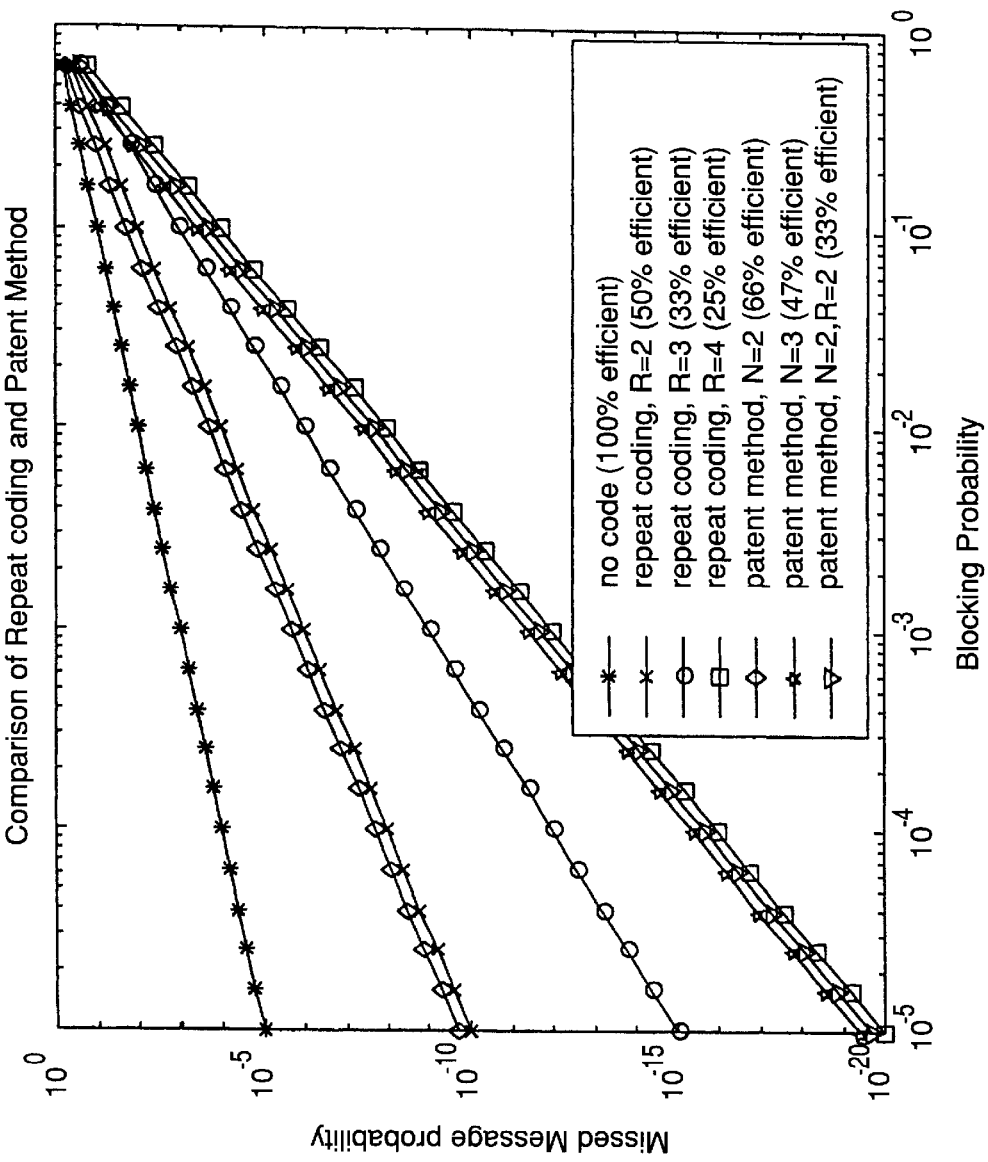
FIG. 9 shows a graphical representation of the performance of repeat coding methods of the prior art versus the performance of the present invention in which a Data Block of a message is divided into N=2 or N=3 Data Segments.

FIG. 9 shows a comparison of performance of the present invention for the embodiments of FIGS. 1, 2, and 3 versus the performance in the case where no coding is used and for methods in which the Data and Error Correcting Segments are transmitted two, three, or four times each. Although the method of the prior art method of transmitting data segments of a data block two times has a similar performance to that of the method of the present invention in which the data block is divided into two Data segments, the efficiency of the method of the present invention is 66% which is notably superior to the 50% efficiency of the prior art method in which the Data segments of a data block are each transmitted twice. Likewise, although the prior art method of transmitting Data and Error Correcting Segments four times has a similar performance to that of the method of the present invention in which the data block is divided into three Data segments (N=3) or the method of the present invention in which the data block is divided into two Data segments in which each Data Segment and Error Correcting Segment is transmitted twice (N=2, R=2). The prior art method of transmitting data segments of a data block four times only has an efficiency of 25% whereas the efficiency for N=3 method of the present invention is superior at an efficiency of 47% and the efficiency of the N=2, R=2 method of the present invention is superior at an efficiency of 33%.

Comparing the results, as shown in FIG. 9, we see that the performance of our method with N=2 is very close to that of repeat coding with R=2. In this case, the efficiency of the repeat coding is only 50%, vs. 66% for our method. This means we get a 32% increase in throughput for the same RF channel, while maintaining a similar message error performance.

In the comparison of our method with N=3 and repeat coding with R=4, both methods provide similar message error protection. In this case, the efficiency of the repeat coding is only 25%, vs. 47% for our method. This means we get a 88% increase in throughput for the same RF channel, while maintaining a similar message error performance.

The case of N=2, R=2 yields performance that is suboptimal when compared with the N=3 case, as it has similar performance but with a lower efficiency. This case is presented because it can be implemented with a simpler algorithm than in the N=3 case.

Figures 10, 11:
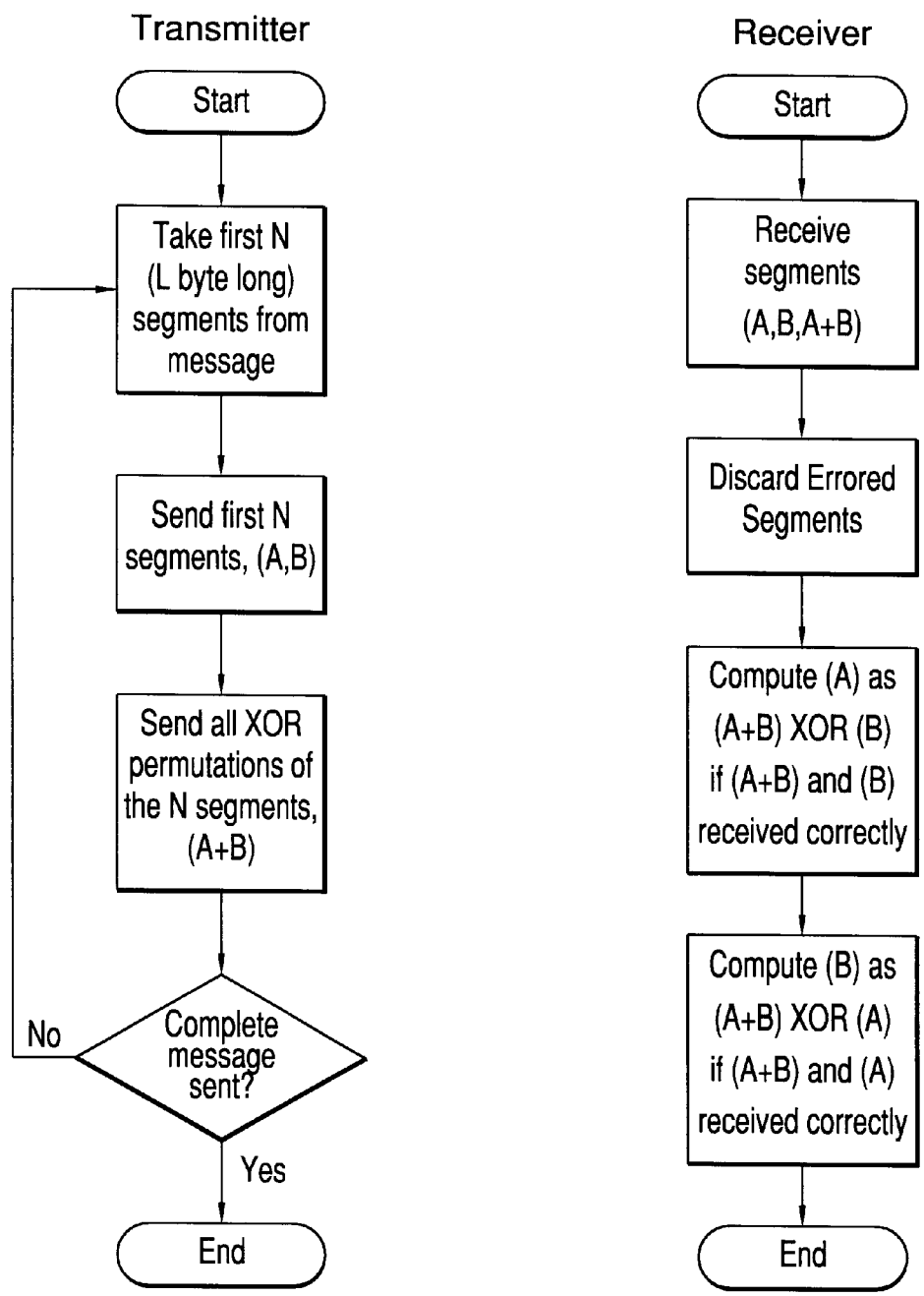
FIG. 10 shows a flow chart for processing for transmission.
FIG. 11 shows a flow chart for processing of the received Data Segment or Error Correcting Segments after transmission.

Flow charts for algorithms to decode and correct messages are shown in FIGS. 10 and 11.

Definition of some Variables that must be set when this Algorithm is Called:

errored_Data Segment or Error Correcting Segment[x]= TRUE if Data Segment or Error Correcting Segment "x" was received correctly and FALSE otherwise Data Segment or Error Correcting Segment[x]=the actual data contained in Data Segment or Error Correcting Segment "x"

The Data Segment or Error Correcting Segment variable is stored directly upon being received, while the errored_Data Segment or Error Correcting Segment variable is defaulted to FALSE, and set to TRUE when a valid CRC is detected for a Data Segment or Error Correcting Segment.

In the Simple Case of [A] [B] [A⊕B] Coding, the Following Algorithm can be Used:

```
if {
  (errored_Data Segment or Error Correcting Segment["A"] ==
  FALSE) and
  (errored_Data Segment or Error Correcting Segment["B"] ==
  TRUE) and
  (errored_Data Segment or Error Correcting Segment["A⊕B"] ==
  TRUE)
  }
  then   Data Segment or Error Correcting Segment["A"] =
XOR(errored_Data Segment or Error Correcting Segment["B"],
errored_Data Segment or Error Correcting Segment["A⊕B"])
  if {
  (errored_Data Segment or Error Correcting Segment["B"] ==
  FALSE) and
  (errored_Data Segment or Error Correcting Segment["A"] ==
  TRUE) and
  (errored_Data Segment or Error Correcting Segment["A⊕B"] ==
  TRUE)
  }
``` then Data Segment or Error Correcting Segment["B"]= XOR(errored_Data Segment or Error Correcting Segment["A"], errored_Data Segment or Error Correcting Segment["A⊕B"])

the above algorithm also works for the case where the [A] [B] [A⊕B] coding is sent multiple times (R>1) for each Data Segment or Error Correcting Segment. In this case, if any Data Segment or Error Correcting Segment is received multiple times, the duplicate is discarded, and the algorithm above applies.

In the case of the more complicated case of arbitrary N, a look-up table is the easiest implementation:

An additional array of constants must be defined to store the look-up table.

look_up_table[x,y,z]=the index of one Data Segment or Error Correcting Segment to be XOR'ed to recreate data segment "x". A value of 0 indicates that no more Data Segment or Error Correcting Segments need to be XOR'ed. The parameter "y" is the index of one of the Data Segment or Error Correcting Segments that can recover data segment "x". Parameter "z" specifies which Data Segment or Error Correcting Segment index that must be XOR'ed. This table can be generated by hand or using a computer program.

A constant defined as MAX_Z is equal to the maximum number of different ways we can correctly XOR Data Segment or Error Correcting Segments to recover an original message In the case of N=2 (detailed immediately above), $$\text{look\_up\_table} = \begin{bmatrix} 2, 3 \\ 1, 3 \end{bmatrix}$$

and MAX_Z=1

In the case of N=3, $$\text{look\_up\_table} = \begin{bmatrix} 2,4,0 & 3,5,0 & 6,7,0 & 2,3,7 \\ 1,2,0 & 3,6,0 & 5,7,0 & 1,3,7 \\ 1,5,0 & 2,6,0 & 4,7,0 & 1,2,7 \end{bmatrix}$$

and MAX_Z=4
for x=1 to N,/* repeat for each of the N information data segments */

```
{
/* only bother with error correction if an error occurred on this
Data Segment or Error Correcting Segment */
    If (errored_Data Segment or Error Correcting
Segment[x]==TRUE)
    then
    {
    z = 1
    flag = FALSE
    while ((z <= MAX_Z) and (flag==FALSE))
    {
    /* check if all required data blocks of this XOR combo was
correctly received */
        flag = TRUE /* flag defaults to true */
        for y = 1:N,
        {
        if (errored_Data Segment or Error Correcting
Segment[y]==TRUE)
            then    flag = FALSE /* set flag false we are missing a combo
*/
        }
                }
    /*flag is now TRUE if we found a way to recover the errored
Data Segment or Error Correcting Segment */
        if (flag==TRUE)
        then
        {
        Data Segment or Error Correcting Segment[x] = Data Segment
or Error Correcting Segment[look_up_table[x,1,z]]
            for y = 2:N,
            {
            /* perform XORs to recover errored Data Segment or Error
Correcting Segment */
            Data Segment or Error Correcting Segment[x] = XOR(Data
Segment or Error Correcting Segment[x], Data Segment or Error
Correcting Segment[look_up_table[x,y,z]])
            }
        }
    }
}
```

Table 1 tabulates the different probability outcomes for retrieving an uncorrupted message part A.

TABLE 1

Computation of Probability of Error for [A] [B] [A⊕B] coding:

| "A" received Correctly? | "B" received Correctly? | "A⊕B" received Correctly? | "A" recovered Correctly? | Probability of Occurrence |
|---|---|---|---|---|
| No  | No  | No  | No  | $Pb^3$ |
| No  | No  | Yes | No  | $(Pb^2)*(1-Pb)$ |
| No  | Yes | No  | No  | $(Pb^2)*(1-Pb)$ |
| No  | Yes | Yes | Yes | $(Pb)*(1-Pb)^2$ |
| Yes | No  | No  | Yes | $(Pb^2)*(1-Pb)$ |
| Yes | No  | Yes | Yes | $(Pb)*(1-Pb)^2$ |
| Yes | Yes | No  | Yes | $(Pb)*(1-Pb)^2$ |
| Yes | Yes | Yes | Yes | $(1-Pb)^3$ |

Computation Complexity and Memory requirements for different methods:
(assuming reasonably long messages)

[A],[B],[A⊕B]: ~1 operation per bit of message, no look-up table

[A],[A],[B],[B],[A⊕B],[A⊕B]: same complexity as case immediately above

[A],[B],[C],[A⊕B],[A⊕C],[B⊕C],[A⊕B⊕C]: approximately 3 operations per bit of message, and 36 element look-up table with a minimum of 3 bits per table entry.

[A],[A],[B],[B ], [C],[C],[A⊕B ],[A⊕B ],[A⊕C], [A⊕C],[B⊕C], [B⊕C],[A⊕B⊕C],[A⊕B⊕C]: same complexity as case immediately above.

The user will appreciate that setting the values within a block of code or providing the values in a look up table are two of the ways to implement the preferred embodiments of the present invention.

A Data Block may be divided into four, five, six, or more Data Segments. Although further division is possible, the improved performance is outweighed by the increased processing time involved and memory required in processing larger look up tables.

The present method may be used in Internet and Intranet broadcasting systems.

The error message rate is related to the bit rate and latency. Latency is defined as the time delay from when the first byte enters the system to when it is output. In the multipoint communications systems, latency is generally limited to a few hundred milliseconds for most applications.

The above description is only illustrative of the invention. Various alternatives and modifications may be made by those skilled in the art without departing from the spirit of the invention. Accordingly, the present invention is intended to embrace all such alternatives, modifications and variances which fall within the scope of the appended claims.

While the invention has been described with reference to preferred embodiments, it will be understood by those skilled in the art that various changes may be made and equivalents may be substituted for elements thereof without departing from the scope of the invention. In addition, many modifications may be made to adapt a particular situation of material to the teachings of the invention without departing from the scope of the invention. Therefore, it is intended that the invention not be limited to the particular embodiments disclosed as the best mode contemplated for carrying out this invention, but that the invention will include all embodiments falling within the scope and spirit of the appended claims.

What is claimed is:

1. A method for transmitting and recovering data from a transmitter to a receiver without requiring communications from the receiver to the transmitter, comprising:
   (a) partitioning a message into N data segments;
   (b) reversibly combining each data segment of the N data segments with at least one other data segment of the N data segments to form at least one error correcting segment; and
   (c) transmitting the N data segments and the at least one error correcting segment.

2. The method of claim 1, wherein the stop of reversibly combining includes an exclusive OR operation.

3. The method of claim 2, wherein N is 2.

4. The method of claim 2, wherein N is 3.

5. The method of claim 2, wherein N is greater than 3.

6. The method of claim 1, further comprising:
   (a) receiving any of the N data segments and the at least one error correcting segment;
   (b) correcting bit errors, where possible, for any of the N data segments and the at least one error correcting segment received;

(c) discarding any of the N data segments and the at least one error correcting segment which are determined not to be correctable;

(d) storing any of the N data segments which are determined not to contain errors or which have been determined to be correctable and have been corrected; and (e) performing operations on any of the at least error correcting segment and data segments which have been determined not to contain errors or which have been determined to have been corrected, the operations being performed to derive any of the N data segments which have not been stored.

7. The method of claim 6, wherein each of the N data segments and each of the at least one error correcting segment is transmitted twice.

8. The method of claim 7, wherein first each of the N data segments and each of the at least one error correcting segment are sent before sending any of the N data segments and the at least one error correcting segment a second time.

9. The method of claim 7, wherein each of the N data segments or each of the at least one error correcting segment is sent twice before sending the next of the N data segments or the at least one error correcting segment.

10. The method of claim 6, wherein each of the N data segments and each of the at least one error correcting segment is transmitted three times.

11. The method of claim 1, wherein the at least one error correcting segment include all the distinct combinations that can be formed by the N data segments.

12. The method of claim 11, wherein each of the N data segments and the at least one error correcting segment are sent R times, where R is a natural number greater than 1.

13. The method of claim 12, all of the N data segments and the at least one error correcting segment are sent once before any of the N data segments and the at least one error correcting segment are sent a second time.

14. The method of claim 12, wherein each of the N data segments and the at least one error correcting segment are sent R times before any other of the N data segments and the at least one error correcting segment are sent.

15. The method of claim 1, wherein each of the N data segments and the at least one error correcting segment are transmitted and at least one of the N data segments and at least one error correcting segment are transmitted at least one additional time.

16. A method for sending and receiving data for a communications system, comprising the steps of:

(a) partitioning a message into a plurality of blocks;

(b) partitioning each of the plurality of blocks into N data segments, N being a natural number greater than 1;

(c) reversibly combining, through the use of Boolean or arithmetic operations, the N data segments into all possible distinct combinations of the N data segments to form error correcting segments, each of the N data segments being used no more than once in forming any of the error correcting segments;

(d) transmitting all the N data segments and the error correcting segments by a transmitter;

(e) receiving the transmitted data segments and error correcting segments by a receiver;

(f) checking the received transmitted data segments and error correcting segments for errors;

(g) if the received data segment is determined not to contain errors, storing the data segment;

(h) if the received data segment or error correcting segment is determined to contain errors, then correcting it if it is determined to be correctable and either storing the corrected data segment or temporarily saving the error correcting segment, otherwise, discarding the data segment or error correcting segment;

(i) if the received error correcting segment is determined not to contain errors, then temporarily saving the error correcting segment in memory;

(j) if one of the transmitted data segments has not been received or has been discarded, performing operations on temporarily saved error correcting segments and stored data segments to derive other data segments; and (k) if a data segment is derived, storing the derived data segment.

17. The method of claim 16, further comprising the step of (i) zero filling data for those data segments which have not been received nor derived or have been discarded.

18. The method of claim 17, further comprising the step of (i) sending out only the data segments which have been stored without zero filling data.

19. The error correcting method of claim 16, wherein the receiver does not transmit any acknowledge or negative acknowledge signal to the transmitter.

20. A method for transmitting and recovering data, comprising:

(a) partitioning a message into N data segments;

(b) reversibly combining each data segment of the N data segments with at least one other data segment of the N data segments, each data segment being used no more than once to form any of the error correcting segments;

(c) transmitting the N data segments and the error correcting segments; and (d) receiving any of the N data segments and error correcting segments.

21. A method for transmitting and recovering data, comprising:

(a) partitioning a message into blocks;

(b) partitioning each of the blocks into N data segments;

(c) reversibly combining each data segment of the N data segments with at least one other data segment of the N data segments to form error correcting segments, each data segment being used no more than once to form any of the error correcting segments;

(d) transmitting the N data segments and the error correcting segments; and (e) receiving any of the N data segments and error correcting segments.

* * * * *